United States Patent
Gruverman (10) Patent No.: US 6,466,039 B1
(45) Date of Patent: Oct. 15, 2002

(54) FERROELECTRIC FILM PROPERTY MEASURING DEVICE, MEASURING METHOD THEREFOR AND MEASURING METHOD FOR SEMICONDUCTOR MEMORY UNITS

(75) Inventor: Alexei Gruverman, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/763,549

(22) PCT Filed: Jun. 23, 2000

(86) PCT No.: PCT/JP00/04128

§ 371 (c)(1),
(2), (4) Date: Jul. 20, 2001

(87) PCT Pub. No.: WO01/01161

PCT Pub. Date: Jan. 4, 2001

(30) Foreign Application Priority Data

Jun. 24, 1999 (JP) ............................................. 11-178238

(51) Int. Cl.[7] ............................................. G01R 31/302
(52) U.S. Cl. ..................... 324/750; 324/658; 324/765
(58) Field of Search ................................. 324/763, 765, 324/766, 158.1, 750, 658; 365/201, 145, 191

(56) References Cited

U.S. PATENT DOCUMENTS 6,114,861 A * 9/2000 Takeo .......................... 324/658

FOREIGN PATENT DOCUMENTS

| JP | 5-119094 | 5/1993 |
| JP | 9-21829 | 1/1997 |
| JP | 9-129694 | 5/1997 |
| JP | 9-232398 | 9/1997 |

* cited by examiner

Primary Examiner—Michael Sherry
Assistant Examiner—Tung X. Nguyen
(74) Attorney, Agent, or Firm—Ronald P. Kananen; Rader Fishman & Grauer (57) ABSTRACT

A ferroelectric film measuring instrument and measuring method of the same which are able to measure the transient current during the polarization inversion of a ferroelectric capacitor having a small capacity with high precision. A pulse generator 10 generates a pulse signal and applies it through a transmission line and a tip 50 to an upper electrode 62 of a ferroelectric capacitor. The output current $i_{FE}$ from a lower electrode 64 at the time of application of the pulse is converted to a voltage $V_o$ by a resistor 30. This is amplified by a preamplifier 40 and output. The current $i_{FE}$ is measured by the output voltage $V_o$. By applying pulses having positive and negative amplitudes twice each in succession to the upper electrode 62, measuring the output currents when the pulses are applied, and finding the difference of the currents according to the first and second pulses, it is possible to eliminate the influence of the charge current of the parasitic capacity of the transmission line, to extract only the polarization current due to the polarization inversion of the ferroelectric, and to measure the characteristics of the ferroelectric film with a high precision.

16 Claims, 5 Drawing Sheets

FERROELECTRIC FILM PROPERTY MEASURING DEVICE, MEASURING METHOD THEREFOR AND MEASURING METHOD FOR SEMICONDUCTOR MEMORY UNITS

TECHNICAL FIELD

The present invention relates to a ferroelectric film characteristic measuring instrument for measuring the characteristics of a ferroelectric film, particularly the electrical characteristics of a ferroelectric capacitor formed by using a ferroelectric film, a measuring method of the same, and a measuring method for measuring a semiconductor memory device by applying the measuring method of the characteristics of the ferroelectric film.

BACKGROUND ART

In recent years, semiconductor memory devices using ferroelectric film have come under attention as ideal memories since they enable access at write and read speeds comparable to those of a DRAM (dynamic random access memory), enable realization of a number of rewrites greater than that of an EEPROM (electrically erasable and programmable read only memory), and do not lose the written information even when power is not supplied, that is, enable so-called non-volatile storage. For this reason, there has been active research into the electrical characteristic of ferroelectric film in the past few years.

When applying an electric field to a ferroelectric thin film, the phenomenon of electrical polarization where a charge is induced at the surface of the ferroelectric crystal takes place. When the direction of the input electric field is inverted, the direction of the polarization also inverts, that is, polarization inversion takes place. Further, there is a characteristic absent in ordinary dielectrics that the polarization of the ferroelectric thin film remains even if the electric field disappears. A memory which stores digital information of "0" and "1" according to the residual polarization of the ferroelectric film has already been realized. Generally, this kind of memory is called a ferroelectric random access memory (FRAM).

In the development of a ferroelectric memory, it is important to obtain an accurate grasp of the characteristics of the ferroelectric materials. For example, since the reliability, the switching time of the polarization inversion, the residual polarization, and other characteristics of the ferroelectric material directly influence the characteristic of the memory, it is important to accurately measure these characteristics of the ferroelectric material to form a semiconductor memory with a high reliability.

Up to now, different kinds of methods have been proposed for measuring the characteristics of a ferroelectric material. One enables measurement of the characteristic of the polarization inversion of the ferroelectric material by measuring the transient current of a capacitor formed by sandwiching a ferroelectric film with two electrodes laid facing each other when applying a pulse signal having a predetermined amplitude to the electrode of the capacitor.

Figure 4:
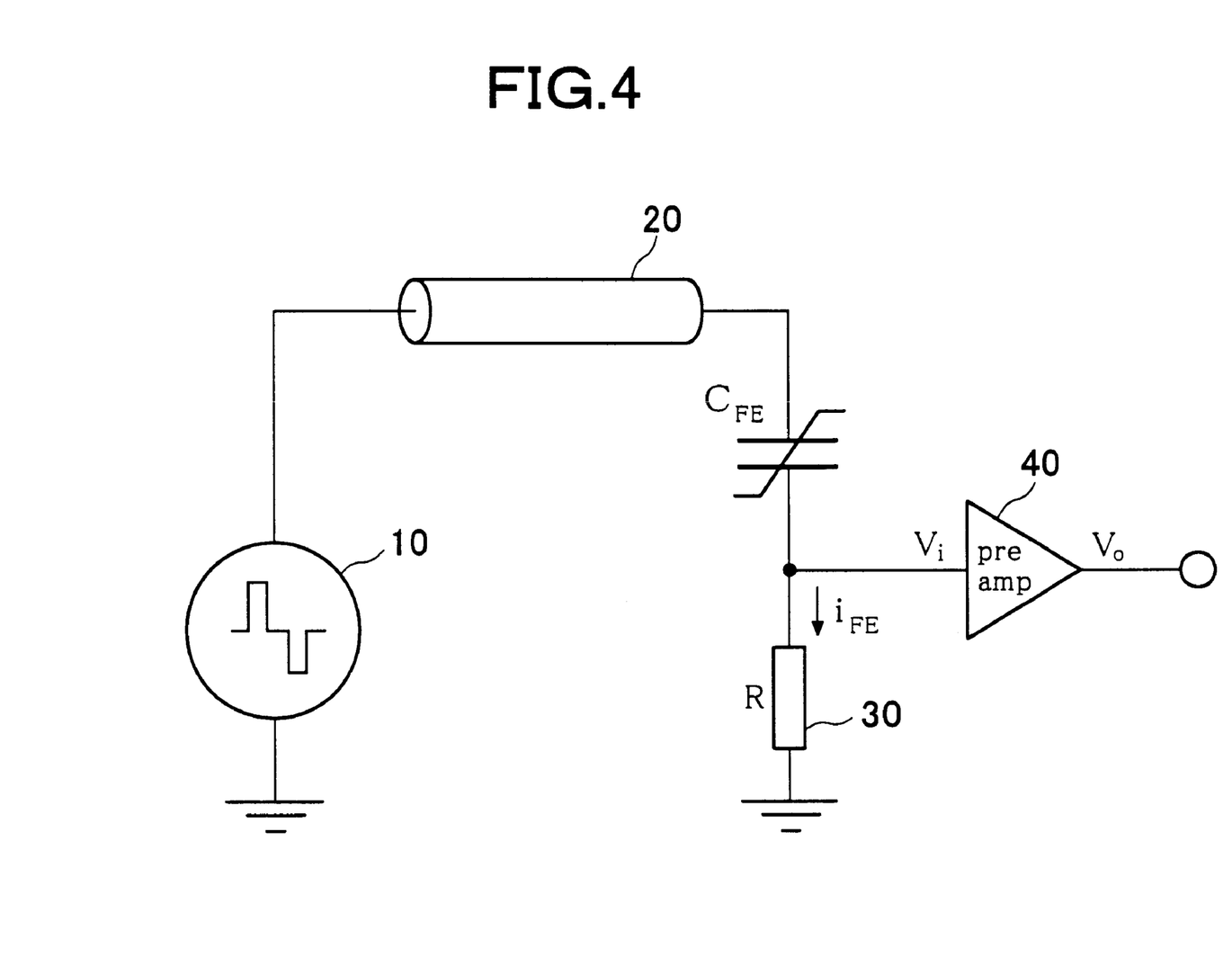
FIG. 4 is a view of an example of a ferroelectric capacitor measuring instrument of the related art.

FIG. 4 shows an example of the measuring instrument for measuring the characteristics of a ferroelectric capacitor. As illustrated, the measuring instrument is constituted by a pulse generator 10, a signal transmission line 20, a resistor 30, and an amplifier (preamplifier) 40. The capacitor $C_{FE}$ is the ferroelectric capacitor to be measured.

In the illustrated measuring instrument, a pulse signal having alternating positive and negative amplitudes (below, referred to as a bipolar pulse) is generated by the pulse generator 10 and applied to the ferroelectric capacitor $C_{FE}$ through a transmission line 20. At the ferroelectric capacitor $C_{FE}$, an electric field in accordance with the applied pulse voltage is generated and polarization occurs accordingly. A current $i_{FE}$ accompanying polarization inversion flows to the capacitor $C_{FE}$ since polarization inversion of the ferroelectric occurs each time a pulse is applied.

Figure 5A:
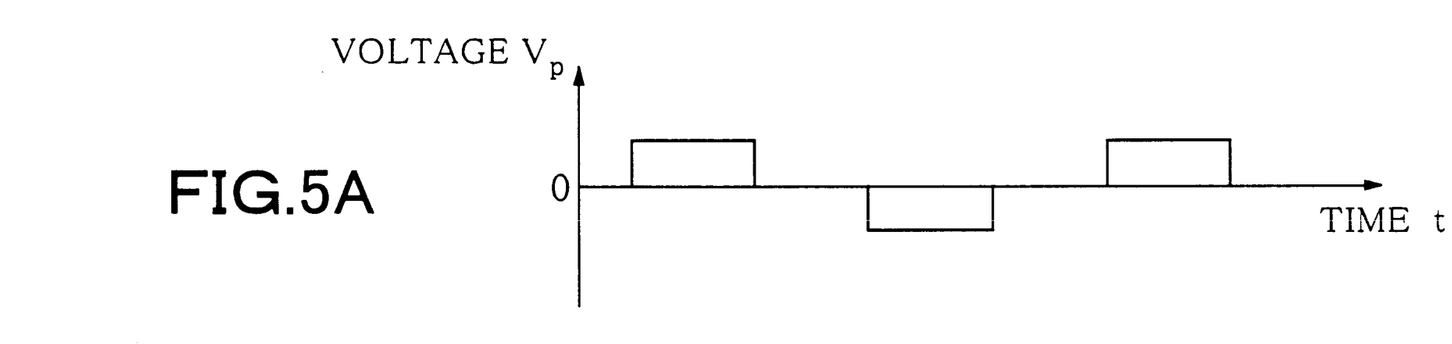
Figure 5B:
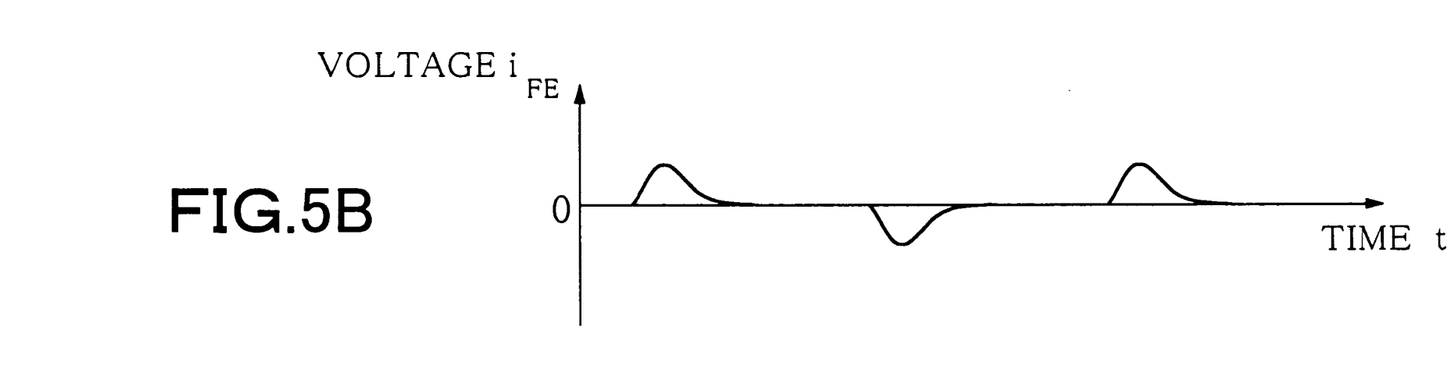

FIGS. 5A and 5B show the waveform of the bipolar pulse applied to the ferroelectric capacitor $C_{FE}$ and the waveform of the transient current $i_{FE}$ of the capacitor $C_{FE}$ when the pulse is applied. The bipolar pulse shown in FIG. 5A is generated by the pulse generator 10 and is applied to the ferroelectric capacitor $C_{FE}$ through the transmission line 20. The transient current $i_{FE}$ shown in FIG. 5B is generated in the ferroelectric capacitor $C_{FE}$ in accordance with this.

Since the current $i_{FE}$ is extremely small and cannot be measured as it is, it is amplified for measurement. In the measuring instrument, the small current $i_{FE}$ is input to the resistor 30 to generates a voltage drop $V_i$. The voltage $V_i$ is input to the preamplifier 40, whereby a voltage $V_o$ amplified by the preamplifier 40 is output. The output voltage $V_o$ of the preamplifier 40 can be further amplified if necessary. In this way, with the ferroelectric capacitor measuring instrument of the present example, the current $i_{FE}$ accompanying the polarization inversion of the ferroelectric capacitor $C_{FE}$ to be measured is converted to the voltage signal $V_i$ and amplified, so the voltage signal $V_o$ with a large amplitude that is able to be observed or measured can be obtained. By measuring the output voltage $V_o$ of the preamplifier 40, the transient current at the time of polarization inversion of the ferroelectric capacitor $C_{FE}$ can be measured and the electrical characteristics of the ferroelectric capacitor $C_{FE}$ can be studied. Particularly, by measuring the transient current $i_{FE}$ of the ferroelectric capacitor $C_{FE}$ at the time of repeated polarization inversion, the fatigue life of the ferroelectric material can be estimated, so this measuring method is an important means for estimating the reliability of the ferroelectric memory.

But along with the increasing capacity and density of semiconductor memories, the dimensions of the ferroelectric thin films used in non-volatile memory devices are becoming smaller. For example, in the recently produced non-volatile memory having a storage capacity of 4 Mb (megabytes), the dimensions of the ferroelectric thin film used in the ferroelectric capacitor are on the submicron order, that is, are smaller than 1 $\mu$m (micrometer). With such a small ferroelectric capacitor, when applying a pulse signal having a predetermined amplitude to the electrodes, the polarization current generated along with the polarization inversion of the ferroelectric is extremely weak and measurement of the polarization current becomes difficult.

Further, in the above ferroelectric capacitor measuring instrument, along with the decrease of the capacity of the ferroelectric capacitor $C_{FE}$ being measured, the effect of the parasitic capacity of the transmission line 20 can no longer be ignored. In this case, since the current due to the charging and discharging of the parasitic capacity is sufficiently larger than the current due to the polarization inversion of the ferroelectric material, there is the demerit that the current $i_{FE}$ generated at the time of polarization inversion of the ferroelectric material cannot be accurately measured based on the output voltage $V_o$ of the measuring instrument.

DISCLOSURE OF THE INVENTION

The present invention was made in consideration with such a circumstance and has as an object thereof to provide a ferroelectric film characteristic measuring instrument which is able to measure the transient current of a ferroelectric capacitor having very small capacity at the time of polarization inversion with a high precision and a measuring method of the same.

To attain the above object, the ferroelectric film characteristic measuring instrument of the present invention is a ferroelectric film characteristic measuring instrument for measuring the characteristics of a ferroelectric film sandwiched between first and second electrodes arranged facing each other, comprising a pulse generator for generating a pulse signal to be input to the ferroelectric film, a conductive probe having a pointed tip for contacting said first electrode and inputting said pulse signal to said first electrode, and a current measuring circuit connected to said second electrode and measuring a current flowing in said ferroelectric film at the time of application of the pulse signal as an output current of said second electrode.

Further, in the present invention, preferably the pulse generator generates a first pulse signal having an alternating positive and negative amplitude and a second pulse signal having only a positive or negative amplitude. Further, the above pulse generator generates pulse signals having a positive amplitude and a negative amplitude twice each in succession. Further, the probe is a tip that is used in a scanning force microscope (SFM) or a scanning tunneling microscope (STM).

Further, the present invention further comprises a processing circuit for calculating the difference between the current measured when said first positive pulse is input and the current measured when said second positive pulse is input. Further, the processing circuit calculates the difference between the current measured when said first negative pulse is input and the current measured when said second negative pulse is input.

Further, the method for measuring the characteristics of a ferroelectric film of the present invention is a ferroelectric film measuring method which measures the characteristics of the ferroelectric film by measuring the current flowing through a ferroelectric film when sandwiching said ferroelectric film between said first and second electrodes and applying predetermined signals to the first and second electrodes, comprising a first step of bringing a thin probe formed by a conductor into contact with said first electrode and applying a pulse signal to said first electrode through said probe, a second step of measuring an output current of said second electrode when applying said pulse signal, and a third step of measuring the characteristics of said ferroelectric film in accordance with the measured current.

Further, in the present invention, preferably, said first step comprises applying a first pulse signal having alternating positive and negative amplitudes and a second pulse signal having only a positive or negative amplitude to said first electrode, said second step comprises measuring said output current when said first and second pulse signals are applied, and said third step comprises measuring the characteristics of the ferroelectric film in accordance with the measured currents when said first and second pulse signals are applied.

Alternatively, in the present invention, preferably, said first step comprises applying pulses having a positive amplitude and a negative amplitude twice each in succession to said first electrode, said second step comprises measuring output currents when the first positive or negative pulse and second positive or negative pulse are applied, and said third step comprises finding the difference between the measured currents when applying the first and second pulses to measure the characteristics of the ferroelectric film in accordance with the difference of the currents.

Further, the method for measuring a semiconductor memory device of the present invention is a method for measuring a semiconductor memory device including a ferroelectric film comprising a first step of selecting any one semiconductor memory device from a plurality of semiconductor memory devices, a second step of sandwiching said ferroelectric film of the selected semiconductor memory device between first and second electrodes, a third step of bringing a thin probe formed by a conductor into contact with said first electrode and applying a pulse signal to said first electrode through said probe, a fourth step of measuring an output current of said second electrode when applying said pulse signal, and a fifth step of measuring the characteristics of said ferroelectric film in accordance with said measured current and measuring the semiconductor memory device in accordance with the results of the measurement.

According to the present invention, it is possible to measure the characteristics of the ferroelectric capacitor by measuring the output current of a second electrode when applying a pulse signal to a first electrode using a thin probe formed by a conductor in a ferroelectric capacitor formed by sandwiching a ferroelectric film with two electrodes arranged facing each other. The pulse signal applied to the first electrode is for example a bipolar pulse having alternately positive and negative amplitudes or a unipolar pulse having only a positive or negative amplitude. It is possible to measure the output currents when applying such pulse signals and measure the transient current generated by the polarization inversion of the ferroelectric. The characteristics of the ferroelectric capacitor are measured based on the results of the measurement. Further, a so-called double pulse generating positive and negative amplitudes twice each in succession is generated and input to the first electrode. By finding the difference of the currents measured when the first and second pulses are applied, the influence of the charge current of the parasitic capacity of the ferroelectric capacitor and the transmission line etc can be removed and only the polarization current accompanying the polarization inversion of the ferroelectric can be measured and therefore the characteristics of the ferroelectric can be accurately measured.

BRIEF DESCRIPTION OF THE DRAWINGS

FIG. 2 consisting of FIGS. 2A and 2B, is a waveform diagram of a transient current of the ferroelectric capacitor when a bipolar pulse is applied.

FIG. 3 consisting of FIGS. 3A and 3B, is a waveform diagram of a transient current of the ferroelectric capacitor when a double pulse is applied.

FIG. 5 consisting of FIGS. 5A and 5B, is a waveform diagram of a ferroelectric capacitor measuring instrument of the related art.

BEST MODE FOR CARRYING OUT THE INVENTION

Figure 1:
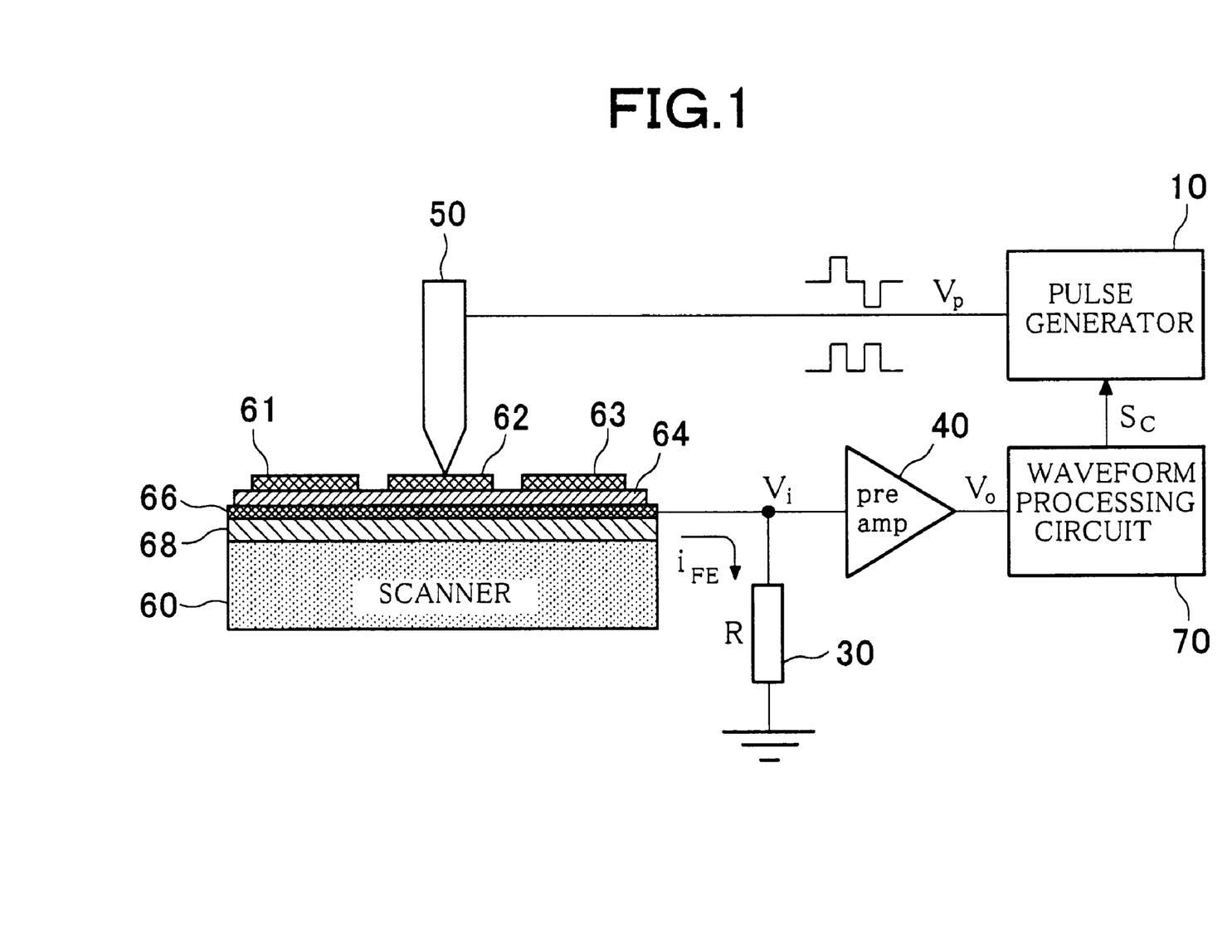
FIG. 1 is a view of a measuring instrument of a ferroelectric capacitor according to an embodiment of the present invention.

FIG. 1 is a view of an embodiment of a ferroelectric capacitor measuring instrument according to the present invention. As illustrated, the ferroelectric capacitor measuring instrument of the present embodiment is constituted by a pulse generator 10, a resistor 40, an amplifier (preamplifier) 40, a tip (probe) 50, a scanner 60, and a waveform processing circuit 70.

Ferroelectric capacitors to be measured are placed on the scanner 60 as illustrated. That is, the ferroelectric capacitors are set on the surface of an insulating layer 68 formed by an insulating material on the surface of the scanner 60. The ferroelectric capacitors are formed by upper electrodes 61, 62, and 63, a lower electrode 66, and a ferroelectric film sandwiched between these electrodes. Note that, in FIG. 1, the ferroelectric film 64 and the lower electrode 66 are shared by the plurality of ferroelectric capacitors. Three ferroelectric capacitors are formed corresponding to the upper electrodes 61, 62, and 63, respectively. The areas of the ferroelectric capacitors, here, for example, the areas of the upper electrodes 61, 62, and 63, are set to a range of $10^4$ $nm^2$ to $10^4$ $\mu m^2$. For applying a pulse signal to such a small capacitor electrode, use of a thin conductive probe is necessary. Further, for applying a pulse to a desired electrode among a plurality of capacitor electrodes arranged adjoining each other, a positioning device capable of determining the position of the conductive probe with a high precision is also necessary.

Here, an explanation will be given of the functions of the parts of the ferroelectric measuring instrument of the present embodiment.

The pulse generator 10 generates a pulse signal $V_p$ having a predetermined amplitude and width and supplies it to the tip 50. The pulse signal $V_p$ has, for example, an amplitude of 1 to 10V and a width of 100 ns to 100 ms.

The tip 50 is a pointed tip used in a scanning force microscope (SFM) or a scanning tunneling microscope (STM), is comprised of a conductive material, and is used for inputting a pulse signal generated by the pulse generator 10 to the electrodes of the ferroelectric capacitors. For example, the tip 50 is a thin rod formed of a conductor material, having a length of several micrometers, having a diameter of several hundred angstroms, and having a pointed front end. By moving the scanner 60, it is possible to bring the tip 50 in point contact with the upper electrode of the desired ferroelectric capacitor. The pulse generated by the pulse generator 10 is input to the upper electrode of the ferroelectric capacitor through the tip 50.

The scanner 60 can be controlled freely in movement in three dimensions. Further, since the position thereof can be determined with a high precision by the positioning device, it is possible to control the tip 50 to come into point contact with the upper electrode of the desired ferroelectric capacitor.

In this way, in the ferroelectric characteristic measuring instrument of the present embodiment, a pulse signal is applied to the electrode of a ferroelectric capacitor by the tip 50 with the pointed end used in a scanning force microscope or scanning tunneling microscope. Further, by using the scanner 60 of these kinds of microscopes, it is possible to control the position with a high precision and it is possible to apply a pulse signal from the tip 50 to the electrode of a desired capacitor among the plurality of arranged ferroelectric capacitors.

The resistor 30 is connected between the common lower electrode 66 of the ferroelectric capacitors and the ground potential GND. The current flowing in any one of the ferroelectric capacitors is input to the resistor 30, whereby a voltage drop $V_i$ is generated.

The preamplifier 40 amplifies the voltage $V_i$ generated by the resistor 0 and outputs the amplified signal $V_o$.

The voltage $V_i$ is input to the preamplifier 40 and the voltage signal $V_o$ amplified by the preamplifier 40 is output. Therefore, by monitoring and measuring the output signal of the preamplifier 40, the transient current of the ferroelectric capacitor being measured can be measured and the characteristics of the ferroelectric capacitor can be measured accordingly.

The waveform processing circuit 70 receives as an input signal the output signal $V_o$ of the preamplifier 40, measures the waveform of that input signal, and measures the characteristics of the ferroelectric capacitor accordingly. For example, the waveform processing circuit 70 converts the input signal $V_o$ into a digital signal by using an A/D converter. Further, it analyzes the waveform of the input signal $V_o$ by a digital processing circuit constituted by a CPU (central processing unit or DSP (digital signal processor) and measures the characteristics of the ferroelectric capacitor accordingly. Further, the waveform processing circuit 70 outputs a control signal $S_c$ for controlling the pulse signal $V_p$ generated to the pulse generator 10 in accordance with the result of the measurement. The pulse generator 10 controls for example the amplitude, pulse width, period, etc. of the pulse signal $V_p$ in accordance with the control signal $S_c$.

Below, an explanation will be given of the measuring method of the ferroelectric characteristic measuring instrument of the present embodiment.

When measuring, the position of the scanner 60 is suitably controlled so that the front end of the tip 50 comes into point contact with the surface of the upper electrode 62 of the ferroelectric capacitor being measured. In FIG. 1, for example, the front end of the tip 50 is controlled to come into point contact with the upper electrode 62, and the characteristics of the ferroelectric capacitor formed by the upper electrode 62, the lower electrode 66, and the ferroelectric film 64 sandwiched between them are measured.

The pulse signal generated by the pulse generator 10 is applied to the upper electrode 62 of the ferroelectric capacitor through the front end of the tip 50. By measuring the output signal $V_o$ of the preamplifier 40 while applying a pulse signal to the upper electrode 62, the characteristics of the ferroelectric capacitor can be measured.

Figure 2A:
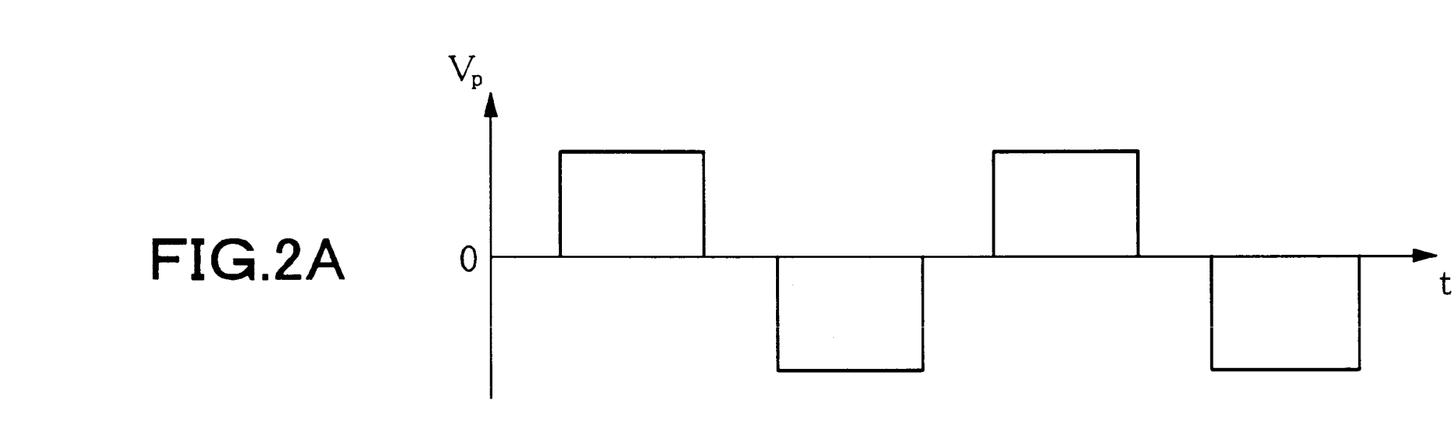
Figure 2B:
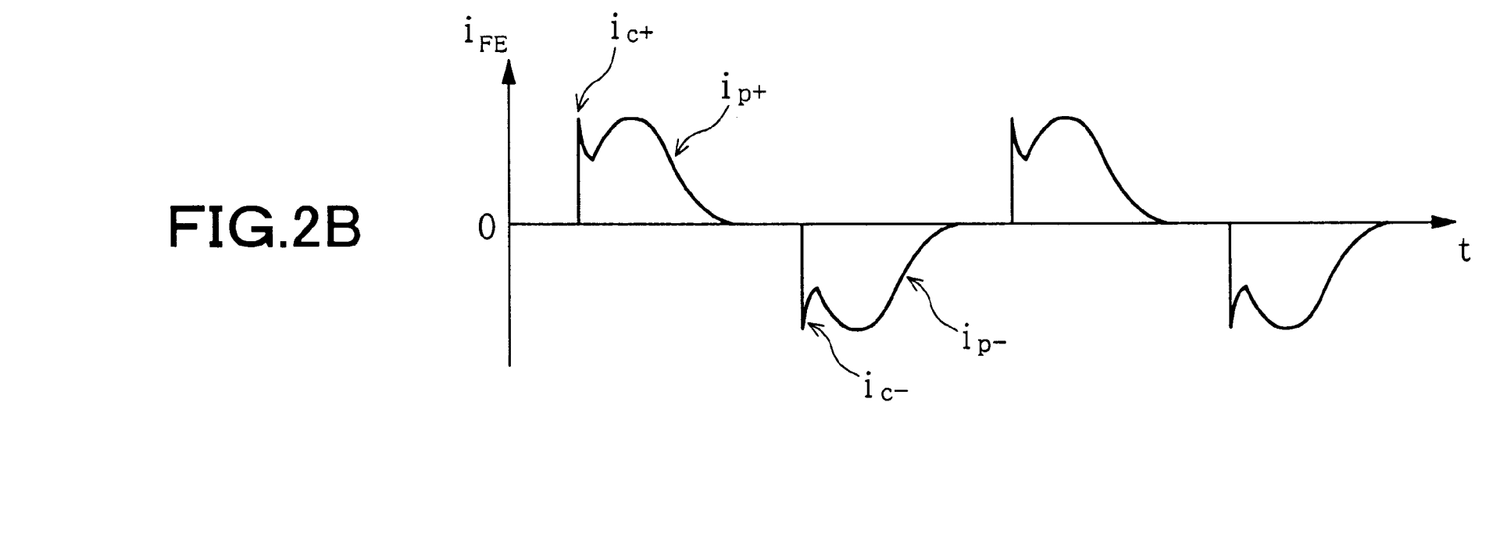

FIGS. 2A and 2B are waveform diagrams of the transient current $i_{FE}$ flowing to the ferroelectric capacitor when the pulse signal $V_p$ is applied to the ferroelectric capacitor. FIG. 2A shows the waveform of a pulse signal with successively switching positive and negative amplitudes, that is, a so-called bipolar pulse signal. Here, the amplitude of the pulse signal $V_p$ is, for example, 1 to 10V, while the pulse width is 100 ns to 100 ms.

FIG. 2B shows the waveform of the transient current $i_{FE}$ of the ferroelectric capacitor when applying the pulse signal $V_p$ shown in FIG. 2A.

As shown in FIG. 2B, a charge current $i_{c+}$ flows to the capacitor in response to the rising edge of the positive pulse. The charge current $i_{c+}$ is generated by the capacity of the ferroelectric capacitor, the parasitic capacity of the not shown transmission line and tip 50, etc. When a predetermined time elapses from the rising edge of the pulse, the charge current $i_{c+}$ vanishes and the polarization current $i_{p+}$ generated by the polarization inversion of the ferroelectric is observed. The result is the same even when a negative pulse is input. As illustrated in FIG. 2B, when the negative pulse is applied, first a charge current $i_{c-}$ appears in the negative direction. After the charge current $i_{p-}$ disappears, the polarization current $i_{p-}$ accompanying the polarization inversion of the ferroelectric in the negative direction is observed. Namely, by applying the bipolar pulse to the ferroelectric, the charge currents $i_{c+}$ and $i_{c-}$ and the polarization currents $i_{p+}$ and $i_{p-}$ can be obtained in positive and negative directions, respectively.

By measuring the polarization currents $i_{p+}$ and $i_{p-}$, the characteristics of the ferroelectric can be studied. If however the output signal of the preamplifier 40 when the pulse is applied is measured as it is, since the charge currents $i_{c+}$ and $i_{c-}$ are also included in the results of the measurement besides the polarization currents $i_{p+}$ and $i_{p-}$ to be originally measured, the polarization currents $i_{p+}$ and $i_{p-}$ cannot be measured correctly.

In the ferroelectric capacitor measuring instrument of the present embodiment, in order to measure the polarization current accompanying the polarization inversion of the ferroelectric capacitor, besides a bipolar pulse, a unipolar pulse, namely, a pulse signal with only a positive or negative amplitude, is applied to the ferroelectric capacitor. According to this, the charge currents $i_{c+}$ and $i_{c-}$ can be measured. By subtracting the charge currents $i_{c+}$ and $i_{c-}$ from the results of measurement when applying a bipolar pulse, the polarization currents $i_{p+}$ and $i_{p-}$ due to the polarization inversion of the ferroelectric can be extracted and the characteristics of the ferroelectric can be measured correctly.

Figure 3A:
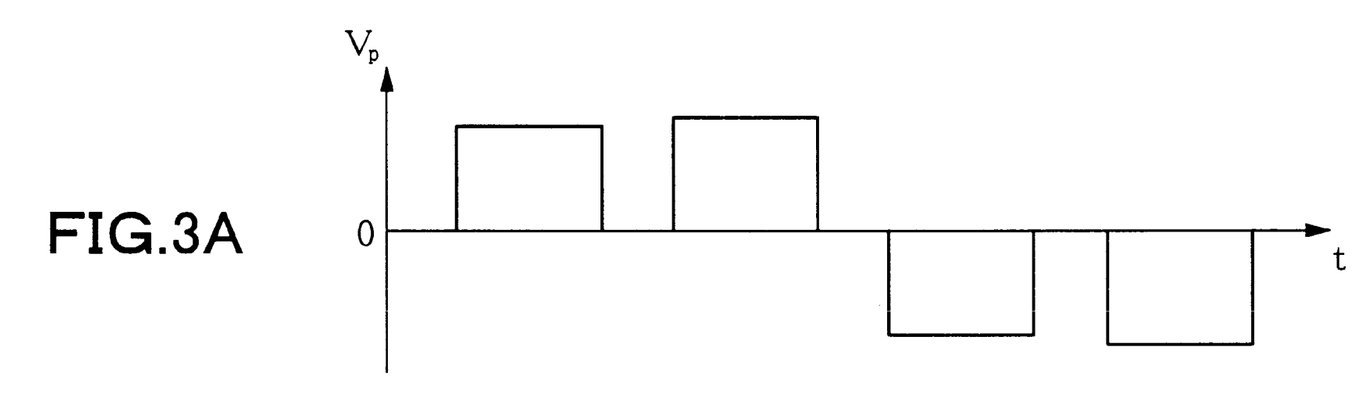
Figure 3B:
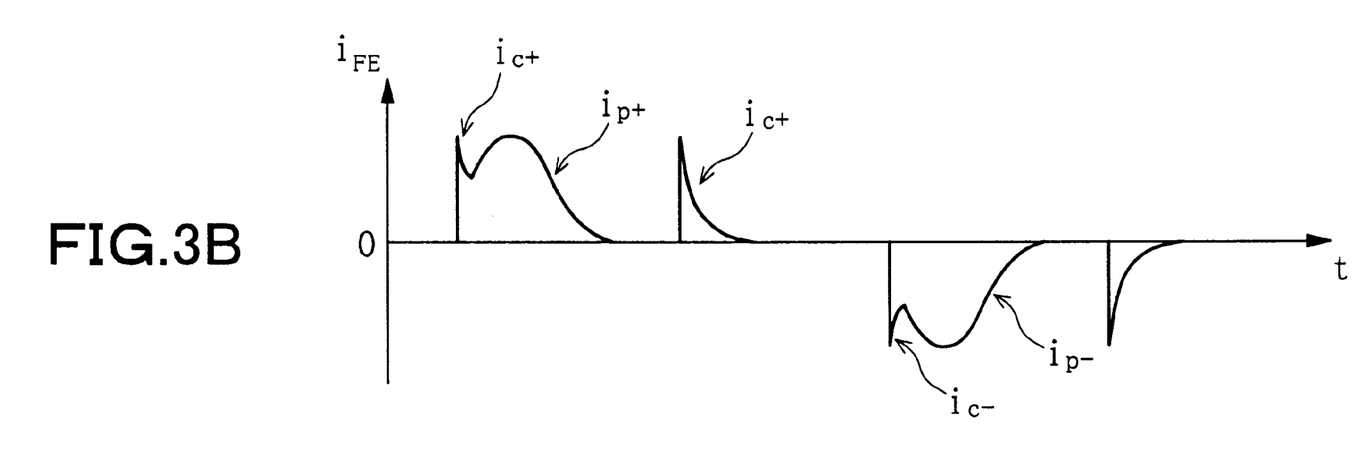

FIGS. 3A and 3B show the waveform of the unipulse and the waveform of the transient current of the ferroelectric capacitor when applying the unipulse. Here, in about the same way as that of the bipolar pulse, the amplitude of the pulse signal $V_p$ is set according to the material, thickness, etc. of the ferroelectric and is, for example, 1 to 10V. Further, the pulse width is set within the range of 100 ns to 100 ms, and the repetition frequency of the pulse is set within the range of 100 ns to 100 ms.

As illustrated in FIG. 3A, when applying a unipolar pulse to the ferroelectric capacitor, the charge current $i_{c+}$ flows in response to the rising edge of the first pulse. The polarization inversion of the ferroelectric occurs in response to the applied electric field, and the polarization current $i_{p+}$ flows. When the second pulse is applied, since the voltage of the pulse has the same polarity, no polarization inversion of the ferroelectric occurs and no polarization inversion current $i_{p+}$ is generated, so only the charge current $i_{c+}$ is observed at the rising edge of the second pulse. Note that, here, it is assumed that the time interval from the first pulse to the second pulse is sufficiently long and all of the charges stored in the ferroelectric capacitor and other parasitic capacity are discharged during that interval.

Substantially the same result is obtained even when applying a unipolar pulse in the negative direction. Namely, as illustrated in FIG. 3A and FIG. 3B, when the first pulse is applied in the negative direction, first a negative direction charge current $i_{c-}$ flows in accordance with the rising and falling of the pulse. After this, the ferroelectric generates a negative polarization current ip due to the polarization inversion in the negative direction. Further, when the second negative pulse is applied, since no polarization inversion of the ferroelectric takes place, only the negative direction charge current $i_{c-}$ is generated.

As described above, by applying a bipolar pulse and unipolar pulse to the ferroelectric capacitor, measuring the transient currents of the ferroelectric capacitor in these cases, and subtracting the measured current in the case of no polarization inversion from the measured current in the case of polarization inversion, the polarization current generated by the polarization inversion of the ferroelectric can be obtained. According to this measuring method, when the capacity of the ferroelectric capacitor is very small and the influence of the charge current of the parasitic capacity cannot be ignored, the influence of the charge current of the parasitic capacity etc can be suppressed and the polarization current of the ferroelectric can be measured with a high accuracy.

Further, as illustrated in FIG. 3A and FIG. 3B, by generating a positive direction pulse and a negative direction pulse twice each, the influence of the parasitic capacity can be removed too. Here, such a pulse signal is referred to as a double pulse. If applying a double pulse, for example, if applying a pulse twice successively in the positive direction, when the first pulse is applied, both the charge current $i_{c+}$ and the polarization current $i_{p+}$ can be observed in accordance with the rising edge thereof. When the second pulse is applied, since no polarization inversion of the ferroelectric occurs, only the charge current $i_{c+}$ is observed. For this reason, by subtracting the second measured current from the first measured current, the polarization current $i_{p+}$ can be obtained.

Further, in the same way, if two pulses are successively applied in the negative direction, when the first negative pulse is applied, polarization inversion of the ferroelectric takes place and a negative polarization current $i_{p-}$ is generated in addition to the negative charge current $i_{c-}$. When the second pulse is applied, no polarization inversion of the ferroelectric takes place, and only the negative charge current $i_{c-}$ is generated. For this reason, by subtracting the second measured current from the first measured current, the negative direction polarization current $i_{p-}$ can be obtained.

As described above, in the ferroelectric film characteristic measuring instrument according to the present embodiment, by applying a pulse signal to one electrode of a ferroelectric capacitor through a pointed tip 50 used in a scanning force microscope or scanning tunneling microscope and measuring the output current from the other electrode, the characteristics of the ferroelectric film are measured. It is therefore possible to eliminate the influence due to the charge current of the parasitic capacity etc. in accordance with the currents measured when applying a bipolar pulse and unipolar pulse to the ferroelectric capacitor. Further, by applying a double pulse to the ferroelectric capacitor and finding the difference of the measured currents when applying the first and second pulses, the influence of the charge current of the parasitic capacity can be eliminated, so the polarization current accompanying polarization inversion of the ferroelectric film can be measured with a high accuracy and the characteristics of the ferroelectric film can be measured correctly.

When measuring a semiconductor device, for example, a ferroelectric memory storing information using the polarization characteristics of the ferroelectric film, using the measuring method of a ferroelectric film of the present invention, it is possible to measure the characteristics of the ferroelectric film of each memory and to judge the characteristics of the ferroelectric memory by the results of the measurement. Further, it is possible to extracting any one or more ferroelectric memories from a large number of ferroelectric memories, measure the ferroelectric film characteristics for the freely extracted ferroelectric memories at a rate of one from a hundred, and measure the characteristics of the ferroelectric memories as a whole in accordance with the results of the measurement. In the process of production of a ferroelectric memory, a large number of ferroelectric memories produced by the same process based on the uniformly managed manufacturing conditions have substantially the same characteristics. For this reason, it is possible to measure one or more freely extracted pieces and statistically estimate the overall characteristics by the result of measurement. Using this measuring method, a reduction of the measurement time and a reduction of the measurement costs can be realized.

Industrial Applicability

As explained above, according to the ferroelectric film characteristic measuring instrument and method of the present invention, there are the merits that the influence of the parasitic capacity of the signal transmission line etc. can be prevented, the polarization current due to the polarization inversion of the ferroelectric can be measured with a high accuracy, and the characteristics of the ferroelectric film and the ferroelectric capacitor using the same can be measured correctly.

Further, according to the measuring method of the semiconductor memory device of the present invention, it is possible to measure the characteristics of the ferroelectric film of a semiconductor memory device freely extracted from a large number of semiconductor memory devices, possible to statistically estimate the characteristics of the semiconductor memory devices as a whole based on the results of measurement, and possible to reduce the measurement costs.

What is claimed is:

1. A ferroelectric film characteristic measuring instrument for measuring the characteristics of a ferroelectric film sandwiched between first and second electrodes arranged facing each other, comprising:

a pulse generator for generating a pulse signal to be input to the ferroelectric film, a conductive probe having a pointed tip for contacting said first electrode and inputting said pulse signal to said first electrode, and a current measuring circuit connected to said second electrode and measuring a current flowing in said ferroelectric film at the time of application of the pulse signal as an output current of said second electrode.

2. A ferroelectric film characteristic measuring instrument as set forth in claim 1, wherein the pulse generator generates a first pulse signal having an alternating positive and negative amplitude and a second pulse signal having only a positive or negative amplitude.

3. A ferroelectric film characteristic measuring instrument as set forth in claim 1, wherein the probe is a tip that is used in a scanning force microscope (SFM) or a scanning tunneling microscope (STM).

4. A ferroelectric film characteristic measuring instrument as set forth in claim 1, wherein said current measuring circuit further comprises:

a resistor connected between said second electrode and a common potential and an amplifier for amplifying the voltage signal generated at said resistor by the output current of said second electrode.

5. A ferroelectric film characteristic measuring instrument as set forth in claim 1, wherein said pulse generator generates pulses having a positive amplitude and negative amplitude twice each in succession.

6. A ferroelectric film characteristic measuring instrument as set forth in claim 5, wherein the interval between the two pulses is set in accordance with electrostatic capacity of the ferroelectric film and other parasitic capacity.

7. A ferroelectric film characteristic measuring instrument as set forth in claim 5, further comprising a processing circuit for calculating the difference between the current measured when said first positive pulse is applied and the current measured when said second positive pulse is input.

8. A ferroelectric film characteristic measuring instrument as set forth in claim 7, wherein said processing circuit calculates the difference between the current measured when said first negative pulse is applied and the current measured when said second negative pulse is applied.

9. A ferroelectric film measuring method which measures the characteristics of the ferroelectric film by measuring the current flowing through a ferroelectric film when sandwiching said ferroelectric film between first and second electrodes and applying predetermined signals to the first and second electrodes, comprising:

a first step of bringing a thin probe formed by a conductor into contact with said first electrode and applying a pulse signal to said first electrode through said probe, a second step of measuring an output current of said second electrode when applying said pulse signal, and a third step of measuring the characteristics of said ferroelectric film in accordance with the measured current.

10. A ferroelectric film measuring method as set forth in claim 9, wherein:

said first step comprises applying a first pulse signal having alternating positive and negative amplitudes and a second pulse signal having only a positive or negative amplitude to said first electrode, said second step comprises measuring said output current when said first and second pulse signals are applied, and said third step comprises measuring the characteristics of the ferroelectric film in accordance with the measured currents when said first and second pulse signals are applied.

11. A ferroelectric film measuring method as set forth in claim 9, wherein:

said first step comprises applying pulses having a positive amplitude and a negative amplitude twice each in succession to said first electrode, said second step comprises measuring output currents when the first positive pulse and second positive pulse are applied, and said third step comprises finding the difference between the measured currents when applying the first and second positive pulses to measure the characteristics of the ferroelectric film in accordance with the difference of the currents.

12. A ferroelectric film measuring method as set forth in claim 9, wherein:

said first step comprises applying pulses having a positive amplitude and a negative amplitude twice each in succession to said first electrode, said second step comprises measuring output currents when the first negative pulse and second negative pulse are applied, and said third step comprises finding the difference between the measured currents when applying the first and second negative pulses to measure the characteristics of the ferroelectric film in accordance with the difference of the currents.

13. A method for measuring a semiconductor memory device including a ferroelectric film comprising:

a first step of selecting any one semiconductor memory device from a plurality of semiconductor memory devices, a second step of sandwiching said ferroelectric film of the selected semiconductor memory device between first and second electrodes, a third step of bringing a thin probe formed by a conductor into contact with said first electrode and applying a pulse signal to said first electrode through said probe, a fourth step of measuring an output current of said second electrode when applying said pulse signal, and a fifth step of measuring the characteristics of said ferroelectric film in accordance with said measured current and measuring the semiconductor memory device in accordance with the results of the measurement.

14. A measuring method of a semiconductor device as set forth in claim 13, wherein:

said third step comprises applying a first pulse signal having alternating positive and negative amplitudes and a second pulse signal having only a positive or negative amplitude to said first electrode, said fourth step comprises measuring said output current when said first and second pulse signals are applied, and said fifth step comprises measuring the characteristics of the ferroelectric film in accordance with the measured currents when said first and second pulse signals are applied.

15. A measuring method of a semiconductor device as set forth in claim 13, wherein:

said third step comprises applying pulses having a positive amplitude and a negative amplitude twice each in succession to said first electrode, said fourth step comprises measuring output currents when the first positive pulse and second positive pulse are applied, and said fifth step comprises finding the difference between the measured currents when applying the first and second positive pulses to measure the characteristics of the ferroelectric film in accordance with the difference of the currents.

16. A measuring method of a semiconductor device as set forth in claim 13, wherein:

said third step comprises applying pulses having a positive amplitude and a negative amplitude twice each in succession to said first electrode, said fourth step comprises measuring output currents when the first negative pulse and second negative pulse are applied, and said fifth step comprises finding the difference between the measured currents when applying the first and second negative pulses to measure the characteristics of the ferroelectric film in accordance with the difference of the currents.

* * * * *